(12) United States Patent
Andou

(10) Patent No.: US 8,981,424 B2
(45) Date of Patent: Mar. 17, 2015

(54) SEMICONDUCTOR DEVICE

(71) Applicant: Renesas Electronics Corporation, Kawasaki-shi, Kanagawa (JP)

(72) Inventor: Takayoshi Andou, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 56 days.

(21) Appl. No.: 13/711,123

(22) Filed: Dec. 11, 2012

(65) Prior Publication Data

US 2013/0146941 A1    Jun. 13, 2013

(30) Foreign Application Priority Data

Dec. 13, 2011    (JP) .................................. 2011-271937

(51) Int. Cl.
| | | |
|---|---|---|
| H01L 29/74 | (2006.01) | |
| H01L 27/02 | (2006.01) | |
| H01L 27/06 | (2006.01) | |
| H01L 29/866 | (2006.01) | |

(52) U.S. Cl.
CPC ........ *H01L 27/0617* (2013.01); *H01L 27/0255* (2013.01); *H01L 29/866* (2013.01)

USPC .......................................... 257/140; 257/355

(58) Field of Classification Search
USPC ........... 257/140, 147, 66, 334–341, 133, 328, 257/355
See application file for complete search history.

(56) References Cited

U.S. PATENT DOCUMENTS

| | | | |
|---|---|---|---|
| 2007/0252168 A1* | 11/2007 | Shimoida et al. ............. | 257/147 |
| 2012/0182659 A1* | 7/2012 | Wang et al. .................. | 361/91.5 |

FOREIGN PATENT DOCUMENTS

| | | |
|---|---|---|
| JP | 8-172190 A | 7/1996 |
| JP | 2001-244463 A | 9/2001 |

* cited by examiner

*Primary Examiner* — Thanh Nguyen
(74) *Attorney, Agent, or Firm* — Foley & Lardner LLP

(57) ABSTRACT

A semiconductor device includes a transistor having a gate electrode, a first electrode, and a second electrode and first and second protection circuits each having one end commonly connected to the gate electrode and the other end connected to the first and second electrodes, respectively. The first and second protection circuits are formed in first and second polysilicon layers, respectively, formed separately on a single field insulating film.

10 Claims, 19 Drawing Sheets

FIG. 2A
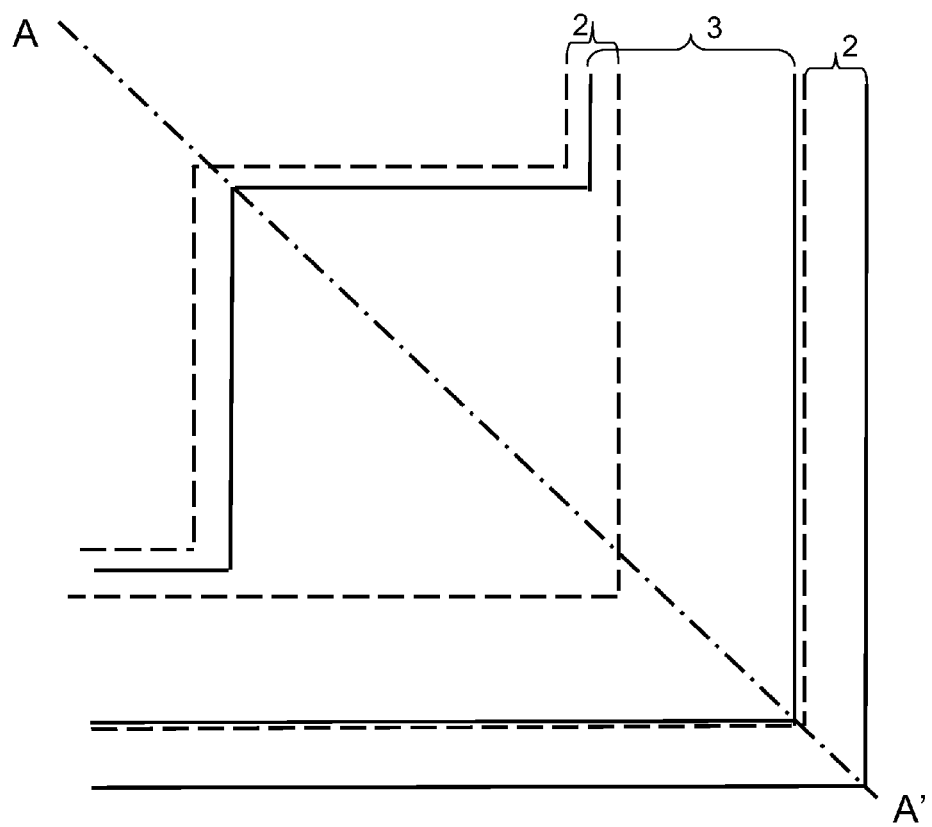
FIG. 2B   A-A' SECTIONAL VIEW
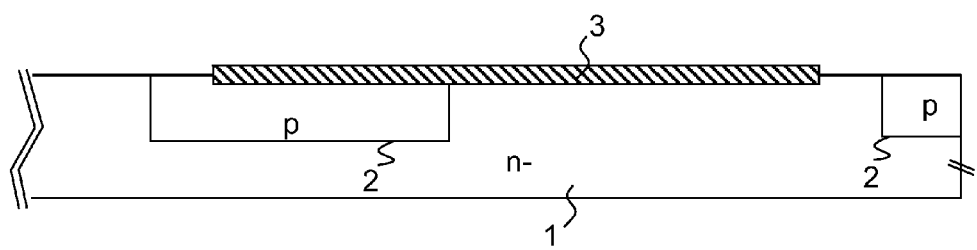

FIG. 5A
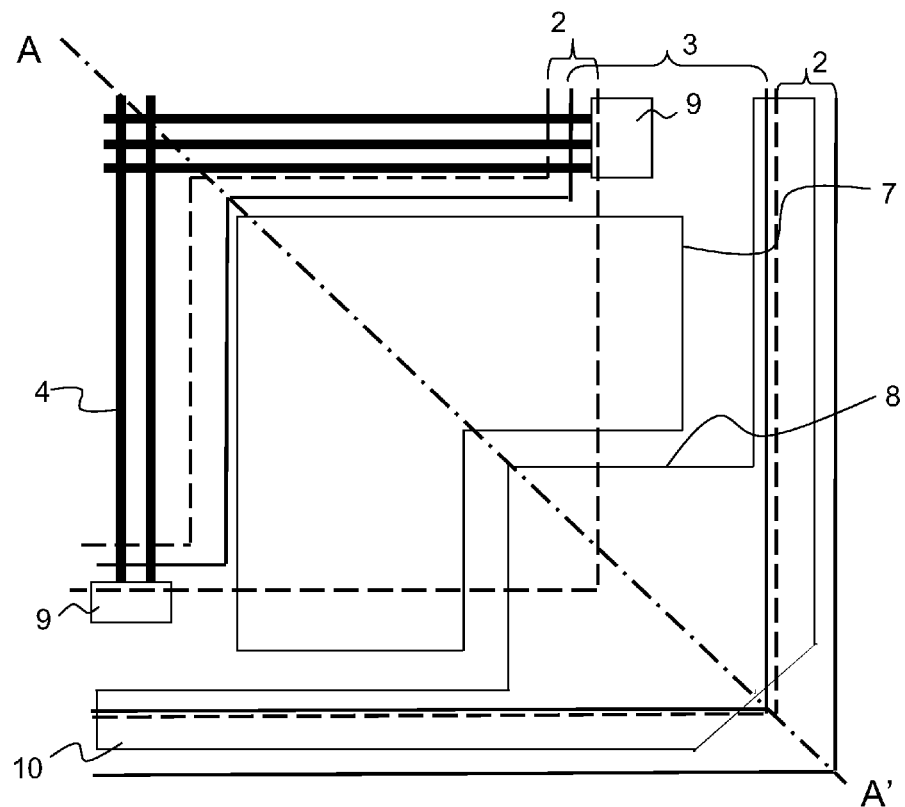
FIG. 5B  A-A' SECTIONAL VIEW
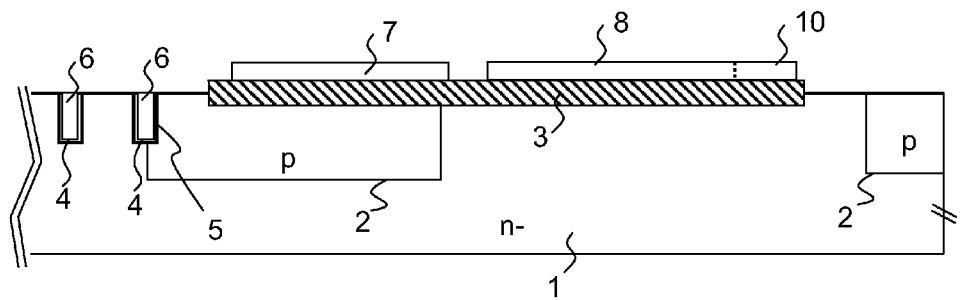

FIG. 6A
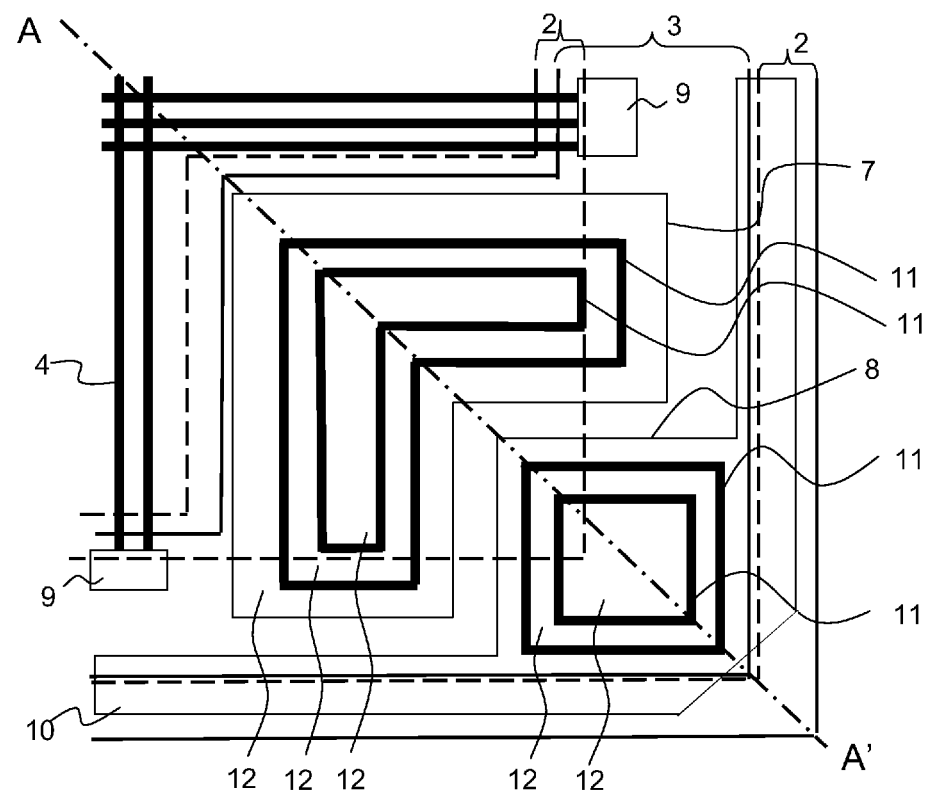
FIG. 6B  A-A' SECTIONAL VIEW
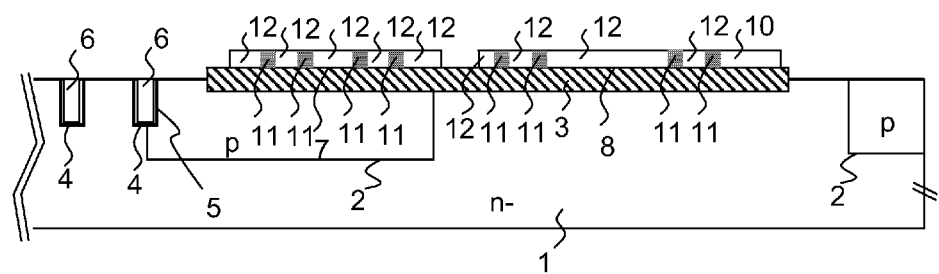

FIG. 7A
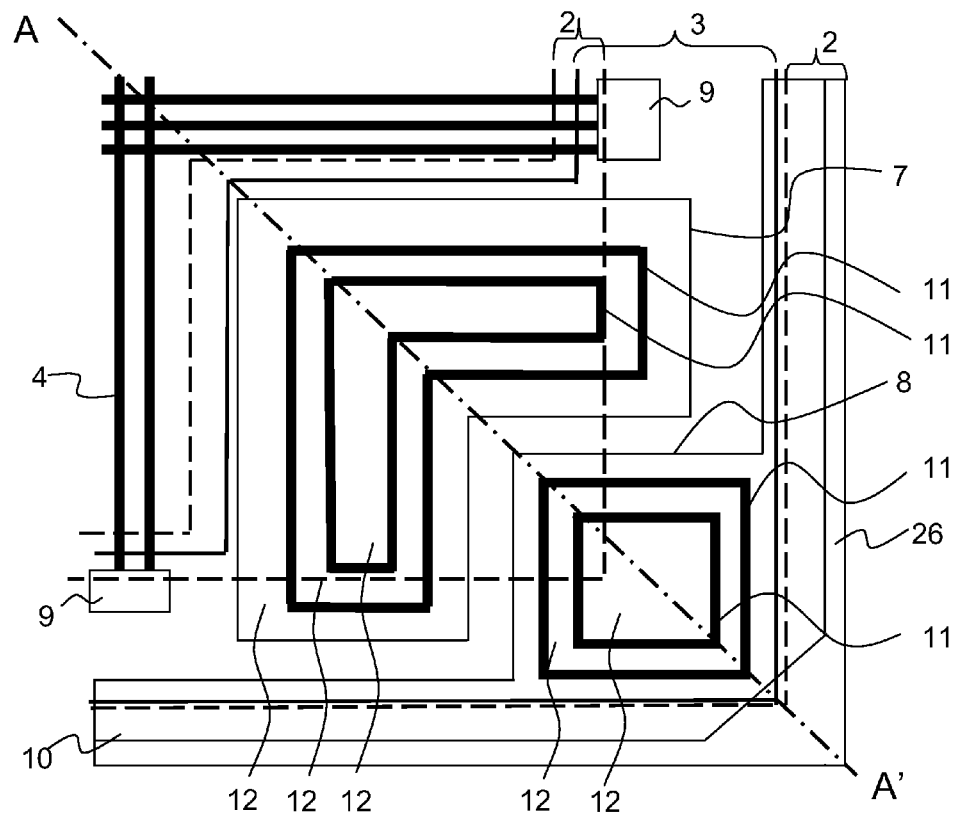
FIG. 7B   A-A' SECTIONAL VIEW
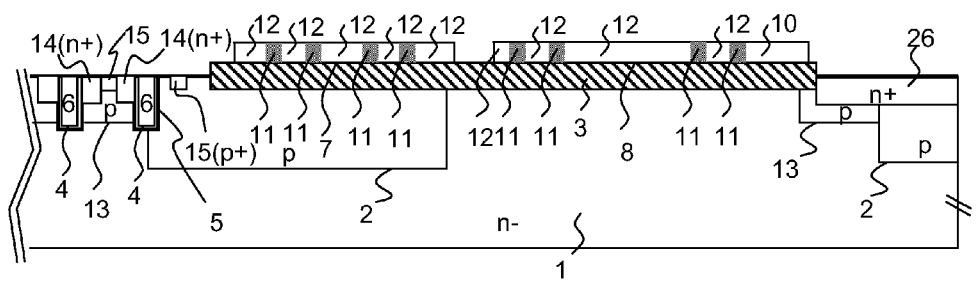

FIG. 8A
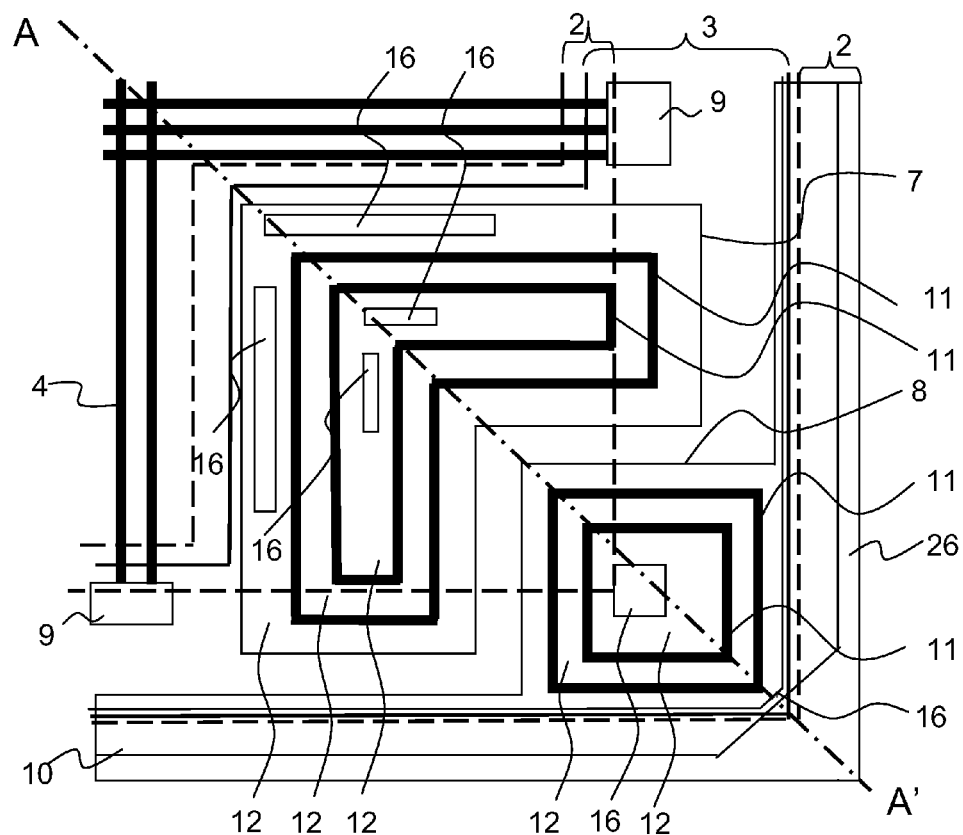
FIG. 8B  A-A' SECTIONAL VIEW
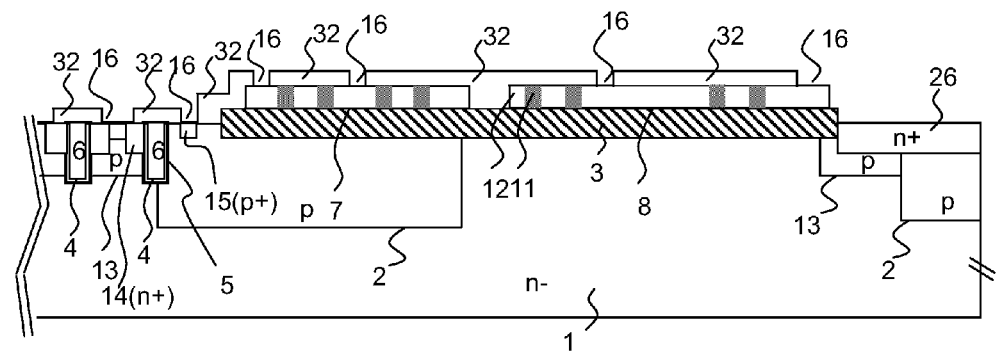

FIG. 9A
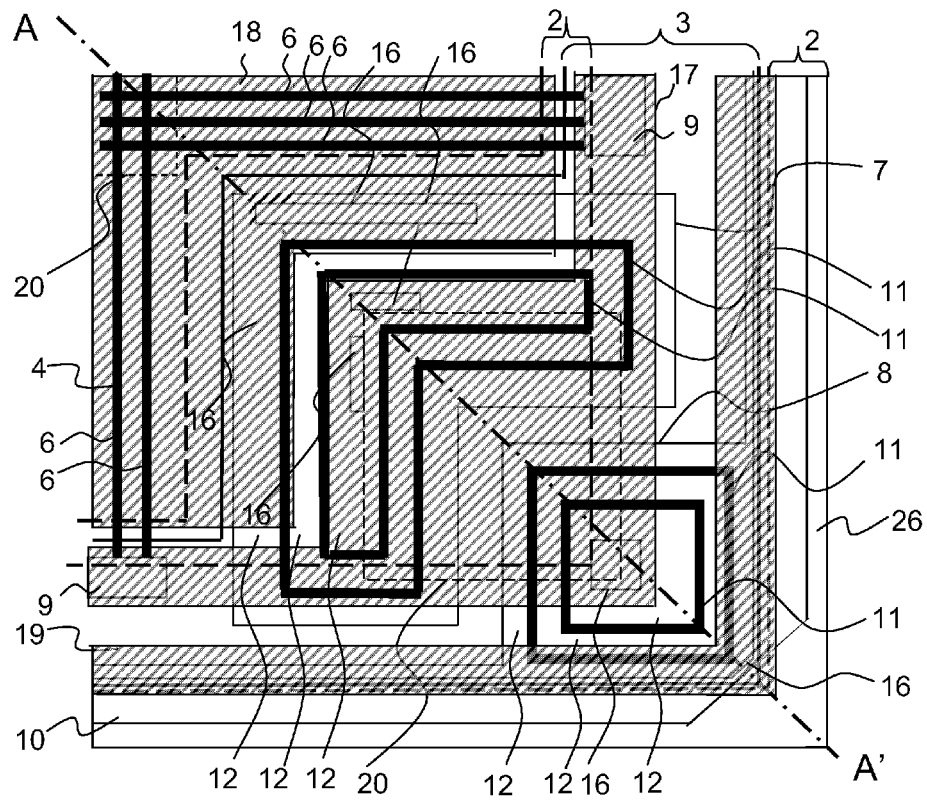
FIG. 9B  A-A' SECTIONAL VIEW
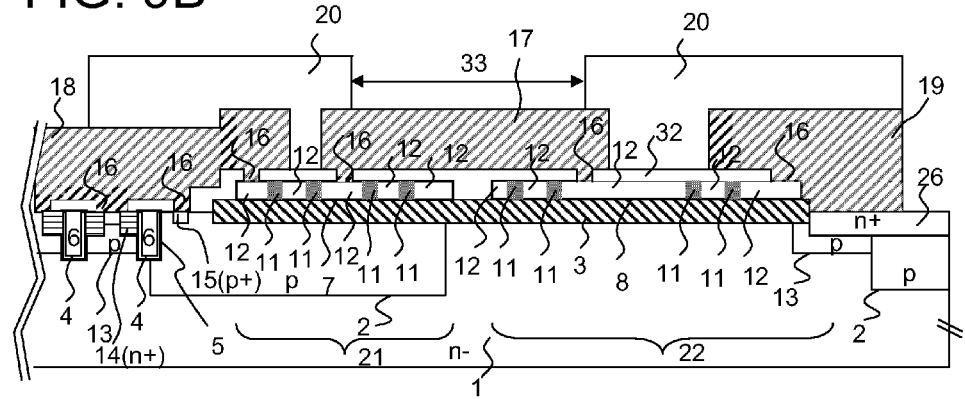

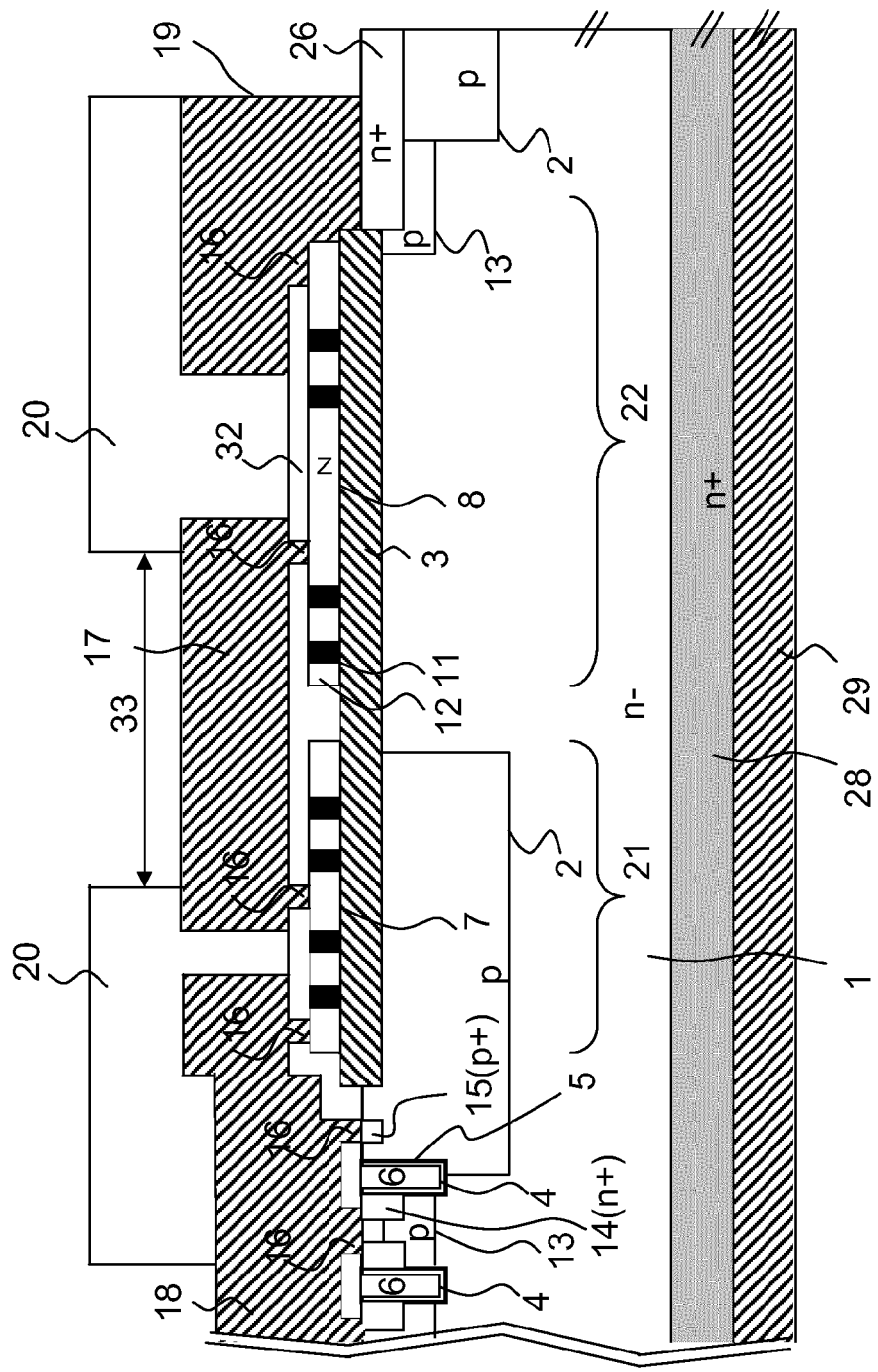

FIG. 13A
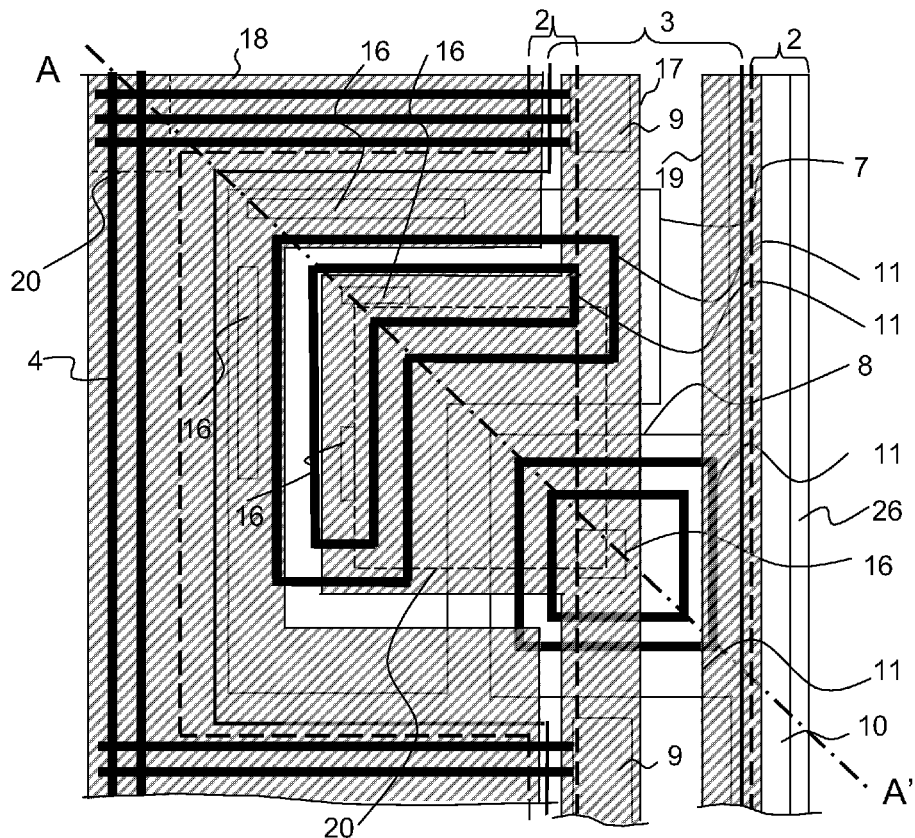
FIG. 13B  A-A' SECTIONAL VIEW
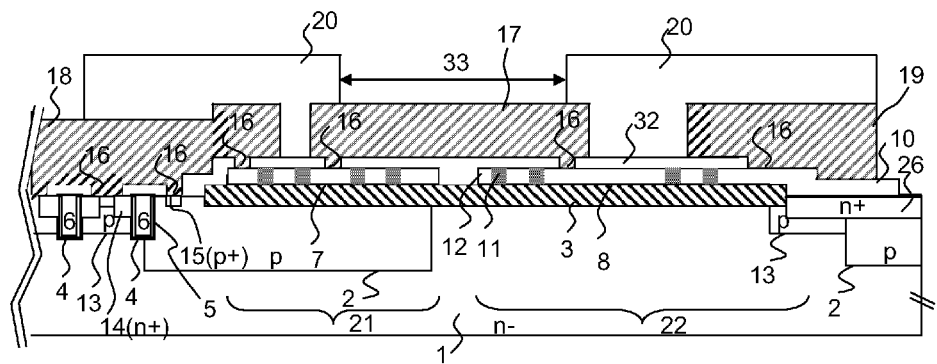

FIG. 14A
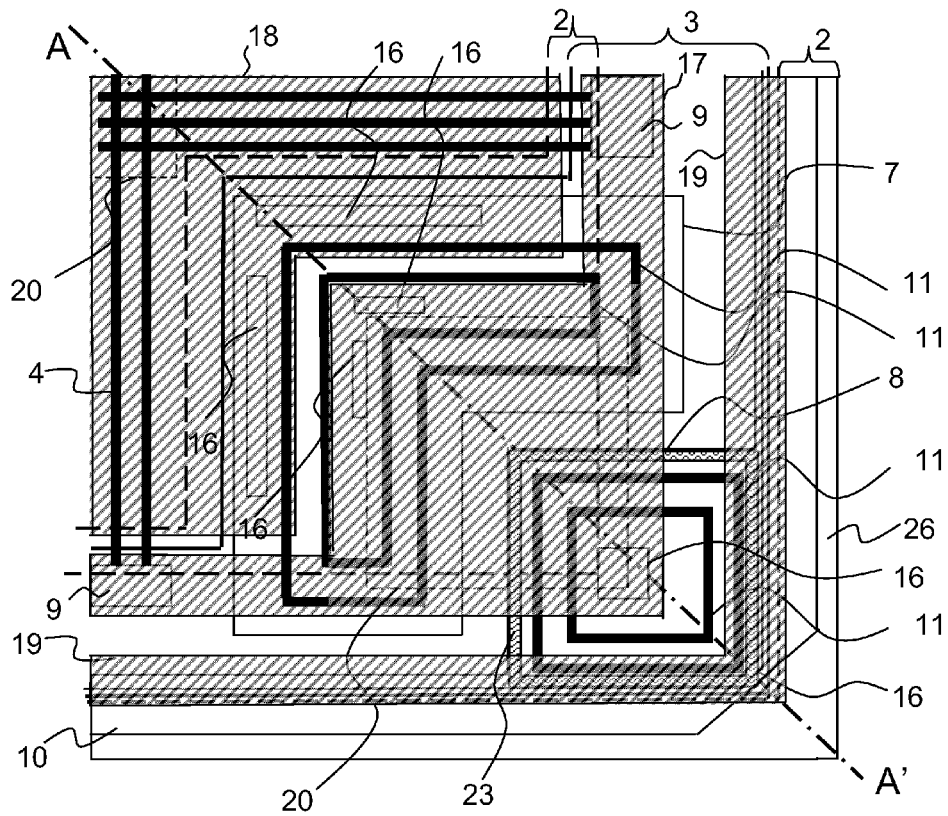
FIG. 14B  A-A' SECTIONAL VIEW
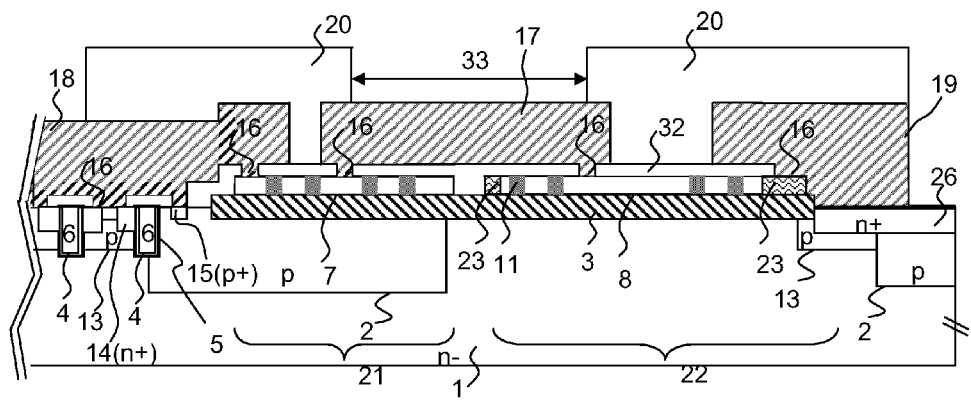

FIG. 17A
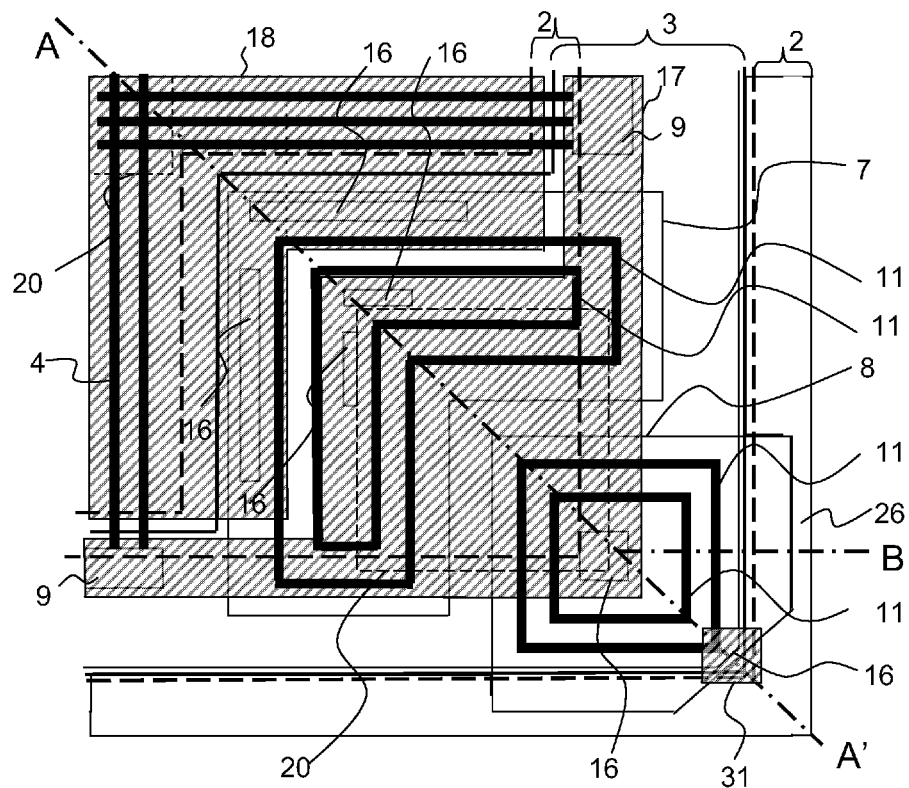
FIG. 17B  A-A' SECTIONAL VIEW
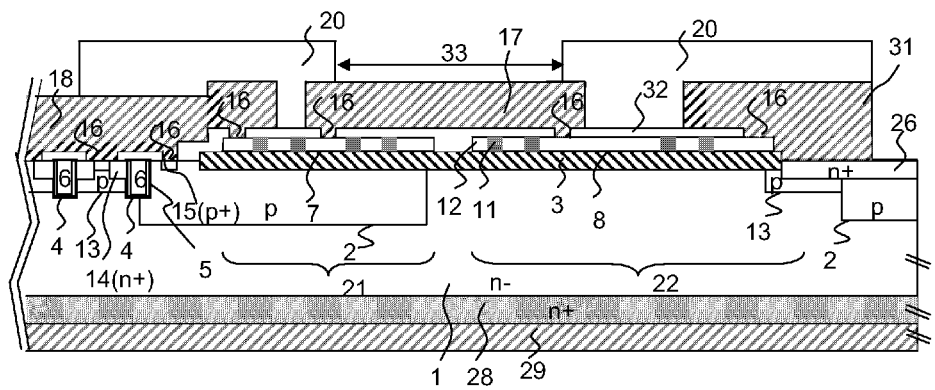

FIG. 19A                                    RELATED ART
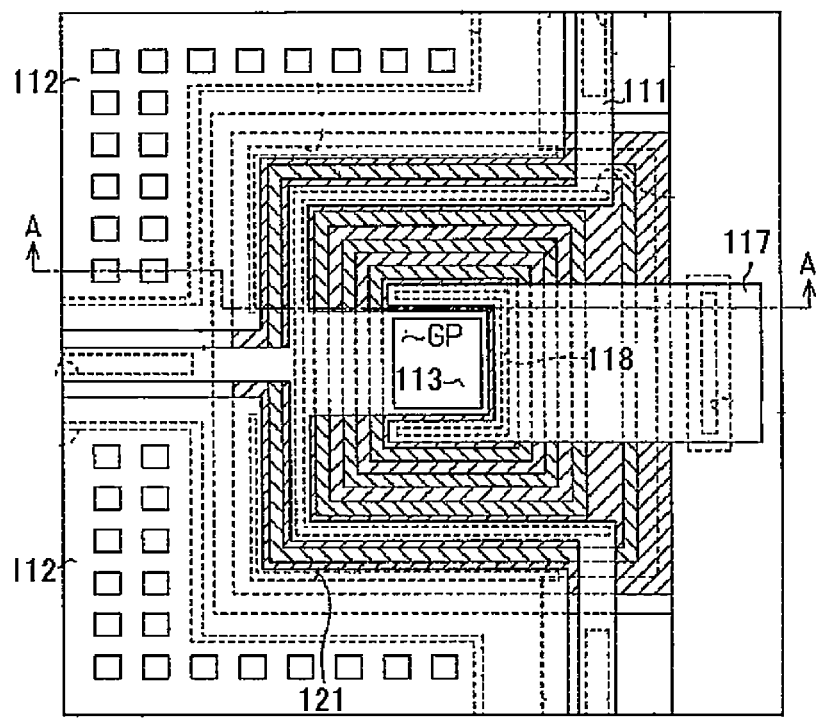
FIG. 19B   A-A SECTIONAL VIEW          RELATED ART
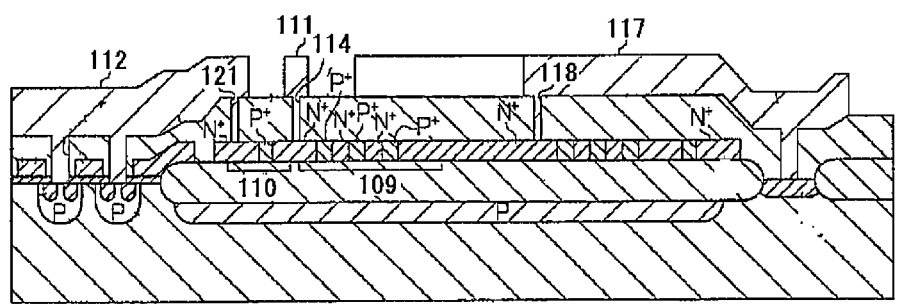

SEMICONDUCTOR DEVICE

REFERENCE TO RELATED APPLICATION

This application is based upon and claims the benefit of the priority of Japanese patent application No. 2011-271937, filed on Dec. 13, 2011, the disclosure of which is incorporated herein in its entirety by reference thereto.

The present invention relates to a semiconductor device. In particular, it relates to a technique for a circuit that protects a gate of a transistor.

BACKGROUND

Technical Field

A power metal-oxide-semiconductor field-effect transistor (MOSFET) and an insulated gate bipolar transistor (IGBT) are widely used as a power control transistor. A protection circuit, including clamp diodes or zener diodes, is often used for a gate of such transistor, to improve resistance to a surge voltage caused by electrostatic discharge or an externally-connected inductor, for example. Patent Literatures (PTLs) 1 and 2 disclose a semiconductor device including such protection circuit.

The semiconductor device disclosed in PTL 1 includes a semiconductor element serving as an active element, first and second main terminals connected to the semiconductor element and a power supply, a control terminal controlling a current flowing between the first and second main terminals, voltage-dividing elements arranged between the first main terminal and the control terminal and dividing a voltage therebetween, and a voltage detection terminal outputting a voltage divided by the voltage-dividing elements. More specifically, the semiconductor device includes clamp diodes corresponding to zener diodes between a collector and a gate of the IGBT, and a dedicated area is arranged for these clamp diodes.

The semiconductor device disclosed in PTL 2 includes at least an area of one conductivity type formed approximately in the center of polysilicon having one plane. In addition, the semiconductor device includes at least a plurality of areas of the other conductivity type and a plurality of areas of one conductivity type alternately arranged to surround the area of one conductivity type. In this semiconductor device, the area of one conductivity type formed approximately in the center is connected to a source or a drain of a transistor, and the outermost area of one conductivity type or the other conductivity type is connected to the drain or the source of the transistor. In addition, an area of one conductivity type or the other conductivity type arranged between the area formed approximately in the center and the outermost area is connected to the gate of the transistor.

More specifically, as illustrated in FIG. 19, gate-drain clamp diodes 109 are collectively arranged inside gate-source zener diodes 110. Hereinafter, only a main portion relating to arrangement of this protection circuit will be described. A source wiring 112 is connected to an $N^+$ type layer located at one end of the gate-source zener diodes 110 via an opening 121. A gate wiring 111 is connected to an $N^+$ type layer located at the other end of the gate-source zener diodes 110 and at one end of the clamp diodes 109 via an opening 114. A drain wiring 117 is connected to an $N^+$ type layer (a rectangular $N^+$ type layer at the center) located at another end of the clamp diodes 109 via an opening 118. The source wiring 112, the gate wiring 111, and the drain wiring 117 are formed as aluminum wirings in the same layer. For connection to the clamp diodes 109, the drain electrode aluminum (drain wiring 117) is extended from an outer periphery of the chip to a center portion of the clamp diodes 109. In addition, the drain electrode aluminum (drain wiring 117) is arranged in a horizontal U shape. A bonding pad 113 for the gate wiring is arranged in a center portion surrounded by the horizontal U-shaped drain wiring 117.

In this semiconductor device, a plurality of areas of one conductivity type and a plurality of areas of the other conductivity type are alternately arranged to surround an area of one conductivity type located approximately in the center of polysilicon. In this way, diodes having a long junction length can be obtained without excessively increasing the chip dimension. In addition, by connecting the areas located approximately in the center of polysilicon and the outermost area of polysilicon to the source and the drain of the transistor and by connecting an area arranged between these areas to the gate of the transistor, a diode can be arranged between the gate and the source and between the gate and the drain of the transistor, without excessively increasing the chip dimension.

[PTL 1]
Japanese Patent Kokai Publication No. JP2001-244463A
[PTL 2]
Japanese Patent Kokai Publication No. JP-H08-172190A

SUMMARY

The following analysis is given by the present invention.

In the case of the semiconductor device disclosed in PTL 1, a dedicated area for the zener diodes needs to be arranged. Thus, when an existing product is provided with a new zener diode (a collector clamp diode, a gate-drain clamp zener diode) to improve resistance to electrostatic discharge, the zener diode needs to be arranged in a part of a valid cell area. Thus, the chip size needs to be increased, resulting in a cost increase. In addition, if the semiconductor device needs to be applied to an existing product and change in chip size is not possible, for example, the on-resistance is increased. Namely, characteristic degradation is unavoidable.

In addition, in the case of the semiconductor device disclosed in PTL 2, since the bonding pad 113 is arranged in the center portion surrounded by the horizontal U-shaped drain wiring 117 because of the shape of the drain electrode aluminum, the area in which the bonding pad 113 can be arranged is limited. Namely, the opening 118 serving as a contact between the group of clamp diodes 109 and the drain wiring 117 needs to be arranged at the rectangular $N^+$ type layer at the center. Therefore, since the bonding pad 113 needs to be formed while avoiding the rectangular $N^+$ type layer at the center, the area in which the bonding pad 113 can be arranged is strictly limited, decreasing the flexibility in layout in chip designing. Thus there is a need in the art.

A semiconductor device according to an aspect of the present invention comprises: a transistor having a gate electrode, a first electrode, and a second electrode; and first and second protection circuits each having one end commonly connected to the gate electrode and the other end connected to the first and second electrodes, respectively; wherein the first and second protection circuits are formed in first and second polysilicon layers, respectively, formed separately on a single field insulating film.

The meritorious effects of the present disclosure include the following, without limitation thereto. According to the present disclosure, an area in which a gate pad can be arranged can be widened. Therefore, the flexibility in layout in chip designing is improved.

BRIEF DESCRIPTION OF THE DRAWINGS

FIGS. 2A and 2B are a plan view and a sectional view, respectively, illustrating a corner portion of the semiconductor device according to the first exemplary embodiment of the present disclosure in a first manufacturing step.

FIGS. 5A and 5B are a plan view and a sectional view, respectively, illustrating the corner portion of the semiconductor device according to the first exemplary embodiment of the present disclosure in a fourth manufacturing step.

FIGS. 6A and 6B are a plan view and a sectional view, respectively, illustrating the corner portion of the semiconductor device according to the first exemplary embodiment of the present disclosure in a fifth manufacturing step.

FIGS. 7A and 7B are a plan view and a sectional view, respectively, illustrating the corner portion of the semiconductor device according to the first exemplary embodiment of the present disclosure in a sixth manufacturing step.

FIGS. 8A and 8B are a plan view and a sectional view, respectively, illustrating the corner portion of the semiconductor device according to the first exemplary embodiment of the present disclosure in a seventh manufacturing step.

FIGS. 9A and 9B are a plan view and a sectional view, respectively, illustrating the corner portion of the semiconductor device according to the first exemplary embodiment of the present disclosure in a eighth manufacturing step.

FIG. 10 is a sectional view illustrating the configuration of the corner portion of the semiconductor device according to the first exemplary embodiment of the present disclosure in a final manufacturing step.

FIGS. 13A and 13B are a plan view and a sectional view, respectively, illustrating another configuration of the semiconductor device according to the first exemplary embodiment of the present disclosure in the eighth manufacturing step.

FIGS. 14A and 14B are a plan view and a sectional view, respectively, illustrating a configuration of a semiconductor device according to a second exemplary embodiment of the present disclosure.

FIGS. 17A and 17B are a plan view and a sectional view, respectively, illustrating a configuration of a semiconductor device according to a fourth exemplary embodiment of the present disclosure.

FIGS. 19A and 19B are a plan view and a sectional view illustrating a configuration of a conventional semiconductor device.

PREFERRED MODES

Figure 1:
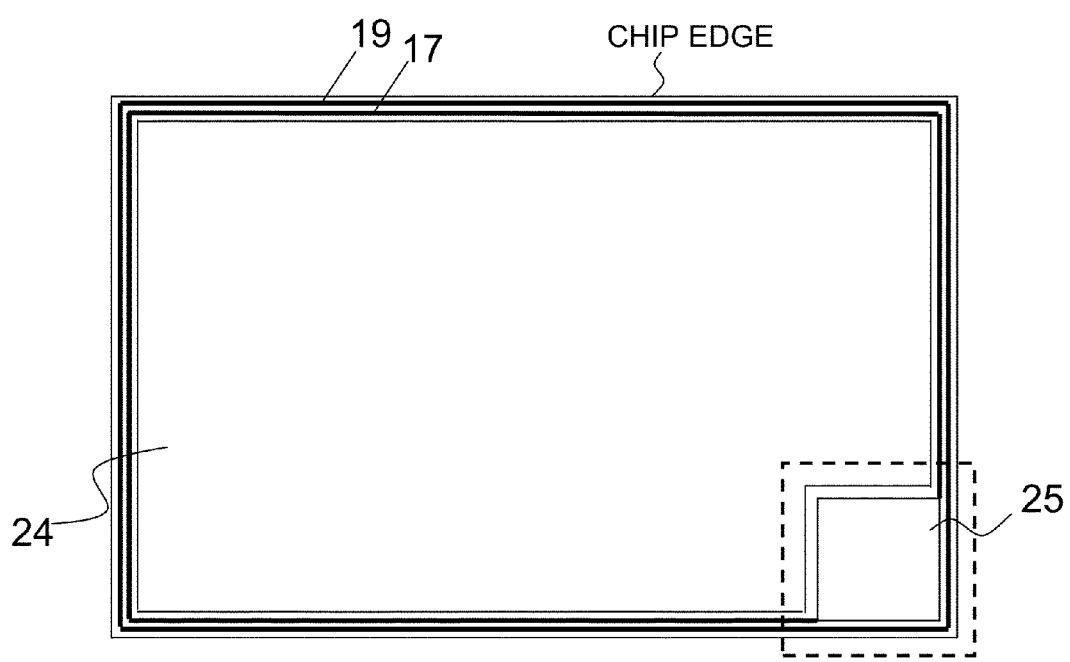
FIG. 1 is a plan view illustrating a configuration of a semiconductor device according to a first exemplary embodiment of the present disclosure.

Next, exemplary embodiments of the present disclosure will be outlined. The reference characters in the following outline are merely used as examples to facilitate understanding of the present disclosure. Namely, the reference characters are not intended to limit the present disclosure to the modes as illustrated in the drawings.

A semiconductor device according to an exemplary embodiment of the present disclosure comprises: a transistor having a gate electrode, a first electrode, and a second electrode; and first and second protection circuits (corresponding to 22 and 21 in FIG. 9B) each having one end commonly connected to the gate electrode and the other end connected to the first and second electrodes, respectively, wherein the first and second protection circuits are formed in first and second polysilicon layers (corresponding to 8 and 7 in FIGS. 9A and 9B), respectively, formed separately on a single field insulating film (corresponding to 3 in FIGS. 9A and 9B).

In the semiconductor device, it is preferable that the first protection circuit comprise: a first center portion (corresponding to rectangular shaped 12 in FIGS. 9A and 9B) of a first conductivity type arranged in a center portion of the first polysilicon layer (corresponding to 8 in FIGS. 9A and 9B); a first band portion (corresponding to 11 in FIGS. 9A and 9B) of a second conductivity type circularly (i.e., as a surrounding loop) arranged outside the first center portion; and a second band portion (corresponding to L-shaped 12 in FIGS. 9A and 9B) of the first conductivity type circularly arranged outside the first band portion. In addition, it is preferable that the second protection circuit comprise: a second center portion (corresponding to 12 in FIGS. 9A and 9B) of the first conductivity type arranged in a center portion of the second polysilicon layer (corresponding to 7 in FIGS. 9A and 9B); a third band portion (corresponding to 11 in FIGS. 9A and 9B) of the second conductivity type circularly arranged outside the second center portion; and a fourth band portion (corresponding to 12 in FIGS. 9A and 9B) of the first conductivity type circularly arranged outside the third band portion. In addition, it is preferable that the first and second center portions be commonly connected to the gate electrode (corresponding to 6 in FIGS. 9A and 9B) via a gate wiring film (corresponding to 17 in FIGS. 9A and 9B), that the second band portion be connected to the first electrode (corresponding to 19 in FIGS. 9A and 9B) that supplies a drain potential, and that the fourth band portion be connected to the second electrode (corresponding to 18 in FIGS. 9A and 9B). For example, in the case of a MOSFET, the first protection circuit can be formed as a protection circuit between the gate and the drain and the second protection circuit can be formed as a protection circuit between the gate and the source. Note that the gate, the drain and the source are corresponding to a control terminal, a first terminal and a second terminal of the MOSFET, respectively.

In the semiconductor device, it is preferable that the Outermost band portion in the first polysilicon layer be connected to the first electrode of the transistor on a chip edge side corresponding to the right side in FIGS. 9A and 9B).

In the semiconductor device, it is preferable that an overall area in which the first and second protection circuits are arranged have an approximately square shape.

In the semiconductor device, at least one of the first and second center portions of the first and second protection circuits may have an L shape as viewed from a direction perpendicular to a substrate.

In the semiconductor device, the other one of the first and second center portions of the first and second protection circuits may have an L shape or a square shape as viewed from the direction perpendicular to the substrate.

In the semiconductor device, the first protection circuit may further comprise another circular band portion of the first conductivity type and another circular band portion of the second conductivity type between the first center portion and the second band portion and the second protection circuit may further comprise another circular band portion of the first conductivity type and another circular band portion of the second conductivity type between the second center portion and the fourth band portion.

In the semiconductor device, the first protection circuit may further comprise a band diffused resistor (corresponding to 23 in FIG. 14) circularly arranged in the first polysilicon layer. The inside of the diffused resistor may be connected to the outermost band portion in the first polysilicon layer, and the first electrode may be connected to the outside of the diffused resistor, instead of the outermost hand portion in the first polysilicon layer.

In the semiconductor device, the transistor may be a metal-oxide-semiconductor field-effect transistor (MOSFET) or an insulated gate bipolar transistor (IGBT).

In the semiconductor device, the first and second protection circuits are formed in separate polysilicon layers on a single field insulating film. In addition, the contact between the first protection circuit and the first electrode is arranged at a part of the outermost band portion of the first protection circuit, the part being closest to a chip edge. Thus, an area in which a gate pad can be arranged can be widened.

Hereinafter, more specific exemplary embodiments will be described in detail with reference to the drawings, by using a MOSFET as an example.

EXEMPLARY EMBODIMENT 1

FIG. 1 is a plan view illustrating a configuration of a semiconductor device according to a first exemplary embodiment of the present disclosure. In FIG. 1, an equi-potential ring (EQR) aluminum layer 19 is arranged at the outermost periphery of the chip, and a gate aluminum layer 17 (gate wiring film) is arranged inside the EQR aluminum layer 19 (first electrode). In addition, a valid cell area 24 is arranged inside the gate aluminum layer 17. The gate aluminum layer 17 is connected to a gate pad area 25 indicated by a dashed line at a corner portion of the chip. A source electrode (second electrode) is formed in the valid cell area 24, and a drain electrode (not shown) is formed on the back surface of the substrate. Note that the gate pad area 25, the drain electrode and the source electrode function as a control terminal, a first terminal and a second terminal of the MOSFET, respectively. The EQR aluminum layer 19 is electrically connected to the drain electrode. In short, the EQR aluminum layer 19 is supplied with a drain potential.

Hereinafter, a configuration of a main portion of the present disclosure will be described based on a series of manufacturing steps, with reference to plan views and sectional views of the gate pad area within the dashed line. FIGS. 2A to 10 are plan views and sectional views illustrating the corner portion of the semiconductor device according to the first exemplary embodiment of the present disclosure. Some of the elements are not illustrated in these plan views and sectional views.

First, as illustrated in FIGS. 2A and 2B, two P-type well layers 2 are formed in an upper portion of an N-type substrate 1 by resist patterning, ion implantation, and thermal treatment. Next, after a nitride film is patterned on the periphery area including the gate pad formation area, LOCOS is executed, to form a thick oxide film layer 3. This oxide film layer 3 corresponds to a field insulating film. In FIG. 2B, the left-side well layer 2 is arranged to surround the valid cell area 24, and the right-side well layer 2 is arranged along the chip edge. A semiconductor substrate formed by stacking an $N^-$ type epitaxial layer on an $N^+$ type high-concentration substrate is often used as the substrate 1. In FIG. 2B, the $N^+$ type high-concentration substrate is not illustrated.

Figure 3:
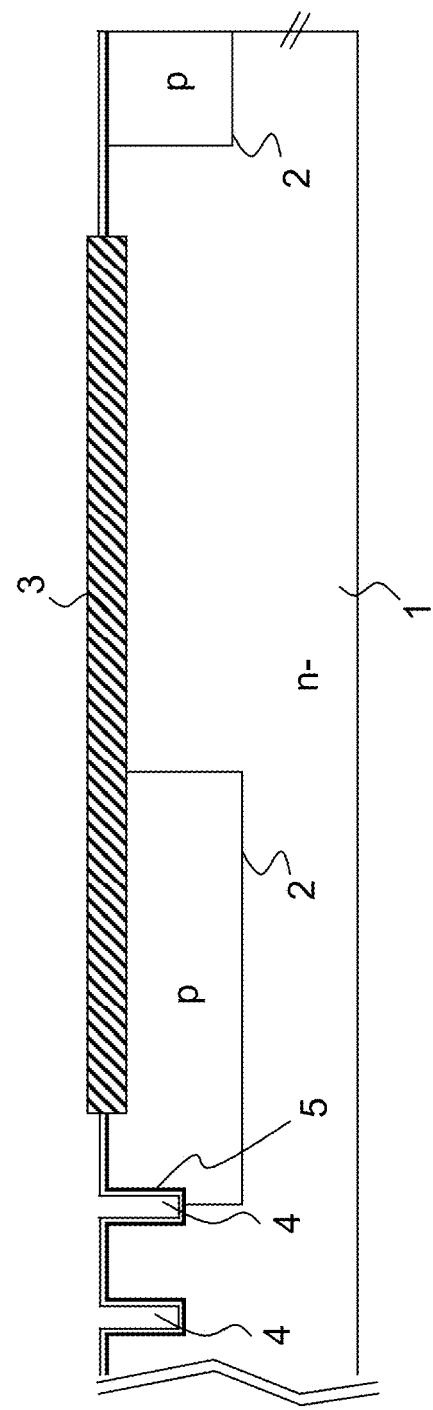
FIG. 3 is a sectional view illustrating the corner portion of the semiconductor device according to the first exemplary embodiment of the present disclosure in a second manufacturing step.

Next, as illustrated in FIG. 3 (a corresponding plan view is not illustrated), to form a gate electrode in the valid cell area 24, trenches 4 are formed by patterning and silicon etching. Next, a gate oxide film 5 is formed on the trench walls of the trenches 4 by thermal oxidation.

Figure 4:
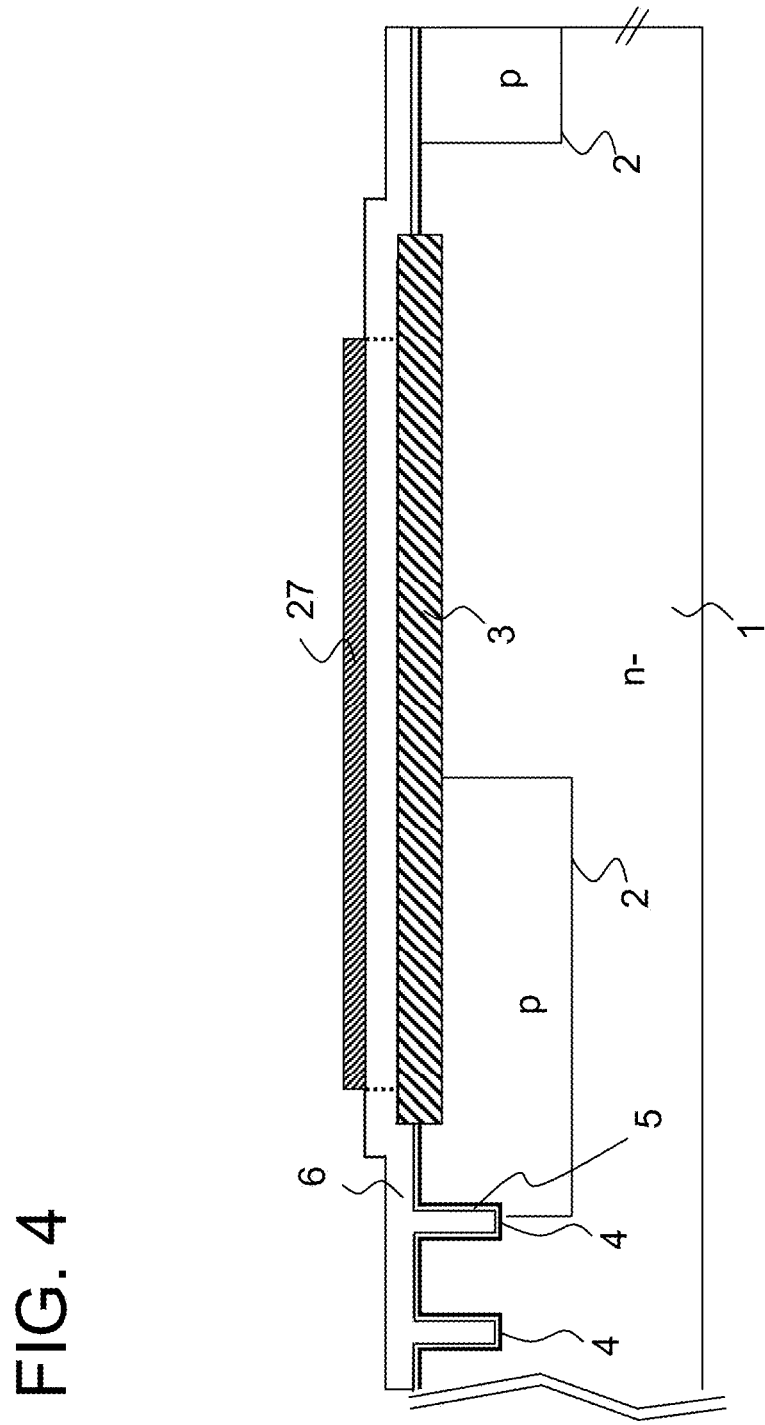
FIG. 4 is a sectional view illustrating the corner portion of the semiconductor device according to the first exemplary embodiment of the present disclosure in a third manufacturing step.

Next, as illustrated in FIG. 4 (a corresponding plan view is not Illustrate), a polysilicon layer 6 is formed on the entire surface including the trenches 4. A portion of the polysilicon layer 6, where zener diodes are subsequently formed, is masked by a resist 27 and is then subjected to ion implantation by using phosphorus, for example. In this way, resistance of the ion implanted portion is lowered. This polysilicon whose resistance has been lowered serves as a gate electrode.

Next, as illustrated in FIGS. 5A and 5B, patterning is executed to form a polysilicon layer (second polysilicon layer) 7 for gate-source zener diodes (second protection circuit), a polysilicon layer (first polysilicon layer) 8 for gate-drain zener diodes (first protection circuit), a gate lead-out polysilicon layer 9, and an EQR polysilicon layer 10. The portions other than the above layers are removed by etch back. The polysilicon layers 8 and 10 are connected to each other and formed as a continuous pattern. The polysilicon layer 6 is left to remain in the trenches 4 and serves as a gate electrode. The polysilicon layer 6 serving as a gate electrode and the gate lead-out polysilicon layer 9 are formed as a continuous pattern. The polysilicon layers 6 and 9, the polysilicon layer 7, and the polysilicon layers 8 and 10 are separated from each other.

Next, as illustrated in FIGS. 6A and 6B, the polysilicon layers 7 and 8 are subjected to ion implantation by using boron, for example, to form zener-diode P layers 11 in the polysilicon layers 7 and 8. Next, the polysilicon layers 7 and 8 are subjected to ion implantation by using arsenic, for example, to form zener-diode N layers 12. When these P and N layers 11 and 12 are formed, the stage number (corresponding to the number of P layers 11 of concentric loop bands) is determined by patterning so that withstand voltage is obtained.

Next, as illustrated in FIGS. 7A and 7B, P type base layers 13, $N^+$ type source layers 14, and $P^+$ type back gate contact layers 15 are formed in the valid cell area 24 by patterning, ion implantation, and thermal treatment. In addition, an $N^+$ diffusion layer identical to the source layers 14 is formed as a scribe diffusion layer 26 in a right-end scribe portion.

Next, as illustrated in FIGS. 8A and 8B, an interlayer film 32 such as a boron phosphor silicate glass (BPSG) is formed, and contact areas 16 are formed by patterning and etching. In this step, contact areas 16 for the gate and the source are formed for the polysilicon layer 7, and contact areas 16 for the gate and the drain are formed for the polysilicon layer 8.

Next, as illustrated in FIGS. 9A and 9B, aluminum, for example, is formed by sputtering or the like and the aluminum is patterned to form a gate aluminum layer 17, a source aluminum layer 18, and an EQR aluminum layer 19. The gate aluminum layer 17 is patterned to cover the gate contact areas 16 of the polysilicon layers 7 and 8. The source aluminum layer 18 is patterned to cover the source contact area of the polysilicon layer 7. The EQR aluminum layer 19 is patterned to cover the drain contact area 16 of the polysilicon layer 8. In this case, the EQR aluminum layer 19 is into contact with the scribe diffusion layer 26. Namely, the EQR aluminum layer 19 is connected to the scribe diffusion layer 26. The potential of the scribe diffusion layer 26 is subjected to a drain potential, thereby the EQR aluminum layer 19 is supplied with the drain potential. Therefore, the EQR aluminum layer 19 is corresponding to the drain to which the gate-drain zener diode is connected.

Finally, for protection, a cover film 20 such as a phosphor silicate glass (PSG) is formed by patterning, so that source and gate wirings can be laid out. An opening portion in the cover film 20 serves as a gate pad opening 33 in which a gate wiring is laid out. The gate pad opening 33 is an area in which a gate pad can be laid out. Portions denoted by reference characters 21 and 22 serve as gate-source zener diodes and a gate-drain zener diodes, respectively. The gate-drain zener diodes 22 operate as a clamp function for protecting the gate-drain path when an excessive drain voltage is applied. By discharging charges caused by static electricity, withstand voltage to electrostatic breakdown between the gate and the drain is improved.

Next, as illustrated in FIG. 10 (a corresponding plan view illustrated), a drain electrode 29 is formed on the back surface of an N$^+$ type high-concentration substrate 28. This is a final form of the semiconductor device according to the present exemplary embodiment.

Figure 11:
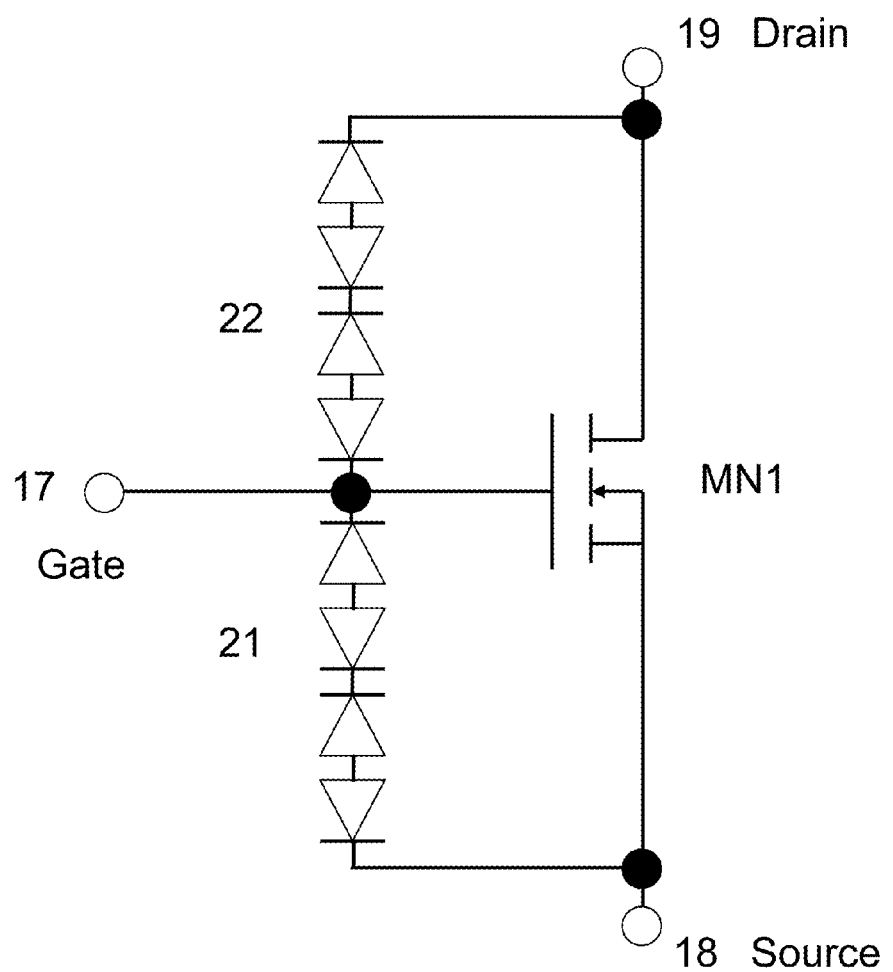
FIG. 11 illustrates an equivalent circuit of the semiconductor device according to the first exemplary embodiment of the present disclosure.

FIG. 11 illustrates an equivalent circuit of the semiconductor device having the above configuration. A MOS transistor MN1 formed in the valid cell area 24 has the gate-source zener diodes 21 between the gate and the source and the gate-drain zener diodes 22 between the gate and the drain.

As described above, in the semiconductor device according to the present exemplary embodiment, the polysilicon layer (second polysilicon layer) 7 for the gate-source zener diodes (second protection element) 21 and the polysilicon layer (first polysilicon layer) 8 for the gate-drain zener diodes (first protection element) 22 are separated from each other as different polysilicon layers, and these polysilicon layers 7 and 8 are formed on the oxide film layer 3. In the polysilicon layer 7 near the source aluminum layer 18, N/P/N/P/N layers of concentric loop bands are formed and used as the gate-source zener diodes 21. In addition, in the polysilicon layer 8 near the EQR aluminum layer 19 (near a chip edge), N/P/N/P/N layers of concentric loop bands are formed and used as the gate-drain zener diodes 22. The gate aluminum layer 17 is into contact with the central N layer (second center portion) 12 of the gate-source zener diode 21 and the central N layer (first center portion) 12 of the gate-drain zener diode 22. The outermost N layer (second band portion) of the gate-drain zener diode 22 near a chip edge serves as a contact between the EQR aluminum layer 19 and the gate-drain zener diode 22. The outermost N layer (fourth band portion) of the gate-source zener diode 21 near the source aluminum layer 18 serves as a contact between the source aluminum layer 18 and the group of the gate-source zener diodes 21.

With this configuration, a contact between the group of the gate-drain zener diodes 22 and a drain node, namely, the position of the contact between the outermost N layer (second band portion) of the polysilicon layer 8 and the EQR aluminum layer 19 is located near a chip edge. In addition, a contact between the group of the gate-source zener diodes 21 and a source node, namely, the position of the contact between the outermost N layer (fourth band portion) of the polysilicon layer 7 and the source aluminum layer 18 is located near the source aluminum layer 18. In this way, the area between these contacts, namely, the area in which the gate pad is formed can be widened (the gate pad opening 33 in FIG. 9B).

In the semiconductor device according to PTL 2, gate-source zener diodes of concentric loop bands are formed in a single polysilicon layer, and gate-drain zener diodes of concentric loop bands are formed inside the gate-source zener diodes. Thus, as seen from FIGS. 19A and 19B, while the opening 121, which is a contact between the group of the gate-source zener diodes 110 and the source node, can be formed at the outermost N layer, the opening 118, which is a contact between the group of the gate-drain zener diodes and the drain node, needs to be formed at the central N layer of the polysilicon layer. Consequently, since a gate pad GP needs to be formed while avoiding this opening 118, the area in which the gate pad GP can be formed is limited.

In contrast, in the semiconductor device according to the present embodiment, the group of the gate-source zener diodes 21 and the group of the gate-drain zener diodes 22 are formed in separate polysilicon layers. In addition, the contact between the source node and the group of the gate-source zener diodes 21 and the contact between the drain node and the group of the gate-drain zener diodes 22 are located near the source electrode and a chip edge, respectively. In this way, the area between the contacts is widened. A gate pad is laid out in this area, and the central N layers of both the polysilicon layers are connected to the gate pad.

With the semiconductor device according to the present exemplary embodiment, only by changing the positions of the polysilicon layers, N and P layers, and contacts, namely, only by changing mask patterns, the area for a gate pad can be widened without increasing the number of process steps, compared with that of the semiconductor device according to PTL 2. Namely, compared to before, the area in which a gate pad can be laid out is widened, and design flexibility is improved. Thus, for example, even when the semiconductor device needs to be applied to an existing product and change in chip size is not possible, the semiconductor device can flexibly accommodate the need.

Figure 12:
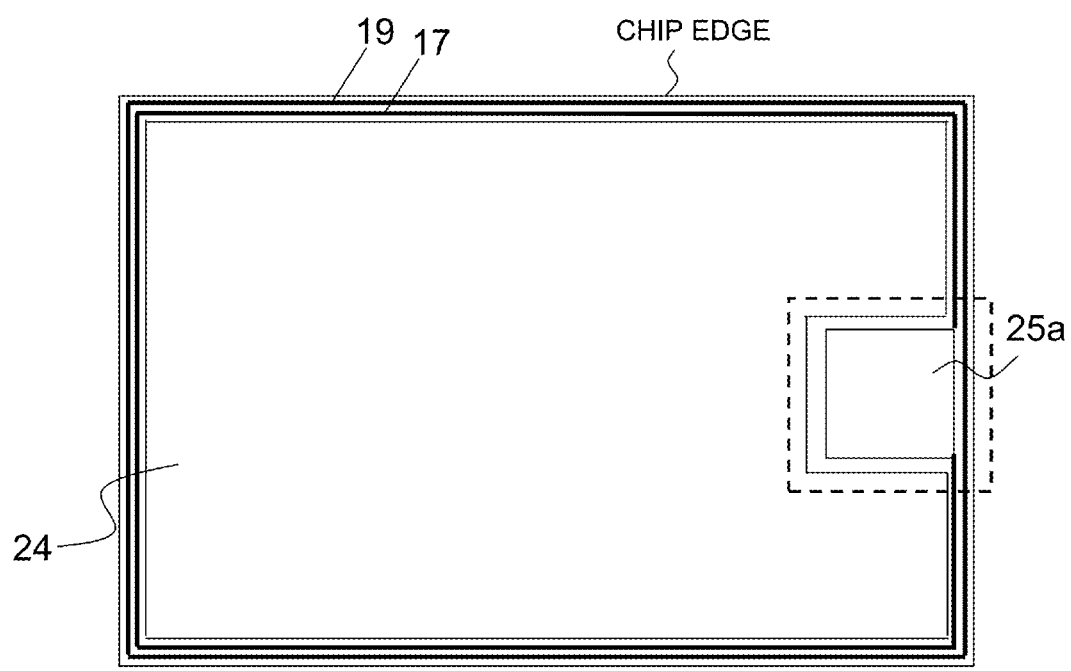
FIG. 12 is a plan view illustrating another configuration of the semiconductor device according to the first exemplary embodiment of the present disclosure.

In the above description, the gate pad is laid out at a corner portion of the chip. However, the present disclosure is not limited to such example. The gate pad can be laid out near a center portion along a chip edge. FIG. 12 is a plan view of a semiconductor device including a gate pad area 25a indicated by a dashed line and located near a center portion along a chip edge. In FIG. 12, reference characters identical to those in FIG. 1 represent identical elements.

FIG. 13A is a plan view of an area including the gate pad area 25a in FIG. 12. FIG. 13B is a sectional view taken along line A-A' in FIG. 13A. As illustrated in FIG. 13B, in the area near the chip edge, the EQR aluminum layer 19 is formed on the EQR polysilicon layer 10. The contact between the EQR aluminum layer 19 and the scribe diffusion layer 26 is formed at a corner portion (not illustrated) of the chip. In this case, the contact between the EQR aluminum layer 19 and the scribe diffusion layer 26 has the same sectional view as that illustrated in FIG. 9B.

EXEMPLARY EMBODIMENT 2

Figure 15:
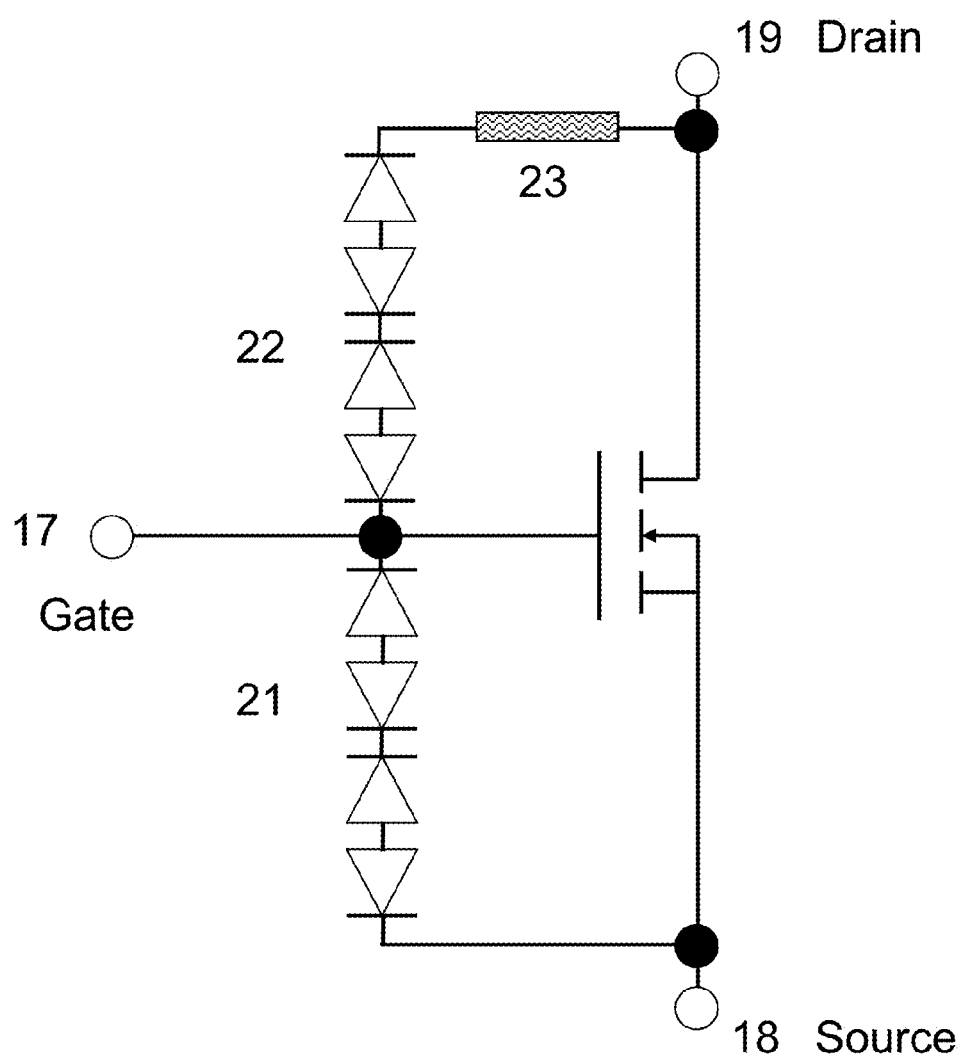
FIG. 15 illustrates an equivalent circuit of the semiconductor device according to the second exemplary embodiment of the present disclosure.

FIGS. 14A and 14B are a plan view and a sectional view, respectively, illustrating a configuration of a semiconductor device according to a second exemplary embodiment of the present disclosure. In FIG. 14, reference characters identical to those in FIG. 9 represent identical elements, and description thereof will be omitted. The semiconductor device according to the present exemplary embodiment includes a low-concentration N⁻ layer 23 outside the outermost N layer 12 in the polysilicon layer 8 for the gate-drain zener diodes 22. The N⁻ layer 23 is formed as a polysilicon layer having concentration lower than that of the N layers 12 for the zener diodes and is formed by ion implantation or the like after the EQR polysilicon layer 10 is formed and patterned. The N⁻ layer 23 serves as a diffused resistor (polysilicon resistor) included in the protection circuit connected to the drain. FIG. 15 illustrates an equivalent circuit of a semiconductor device having such configuration. In contrast to the circuit in FIG. 11, the circuit in FIG. 15 includes a diffused resistor corresponding to the N⁻ layer 23 between the drain and the gate-drain zener diodes 22 of the MOS transistor MN1.

With such semiconductor device as described above, for example, even when the stage number of the gate-drain zener diodes 22 is insufficient and a sufficient clamp voltage cannot be ensured, the N⁻ layer 23 serves as a resistor connected in series with the zener diodes 22 and absorbs the applied voltage. As a result, resistance to ESD can be improved. In addition, the N⁻ layer 23 can have an arbitrary resistance value by changing the ion implantation dose amount when formed. Thus, the N⁻ layer 23 serves as an element for adjusting the clamp voltage.

EXEMPLARY EMBODIMENT 3

In the first exemplary embodiment, the area in which the gate-source zener diodes 21 are formed has an L planar shape, and the area in which the gate-drain zener diodes 22 are formed has a rectangular planar shape. However, according to a third exemplary embodiment, both the gate-source and gate-drain zener diodes 21 and 22 have an L planar shape.

Figure 16:
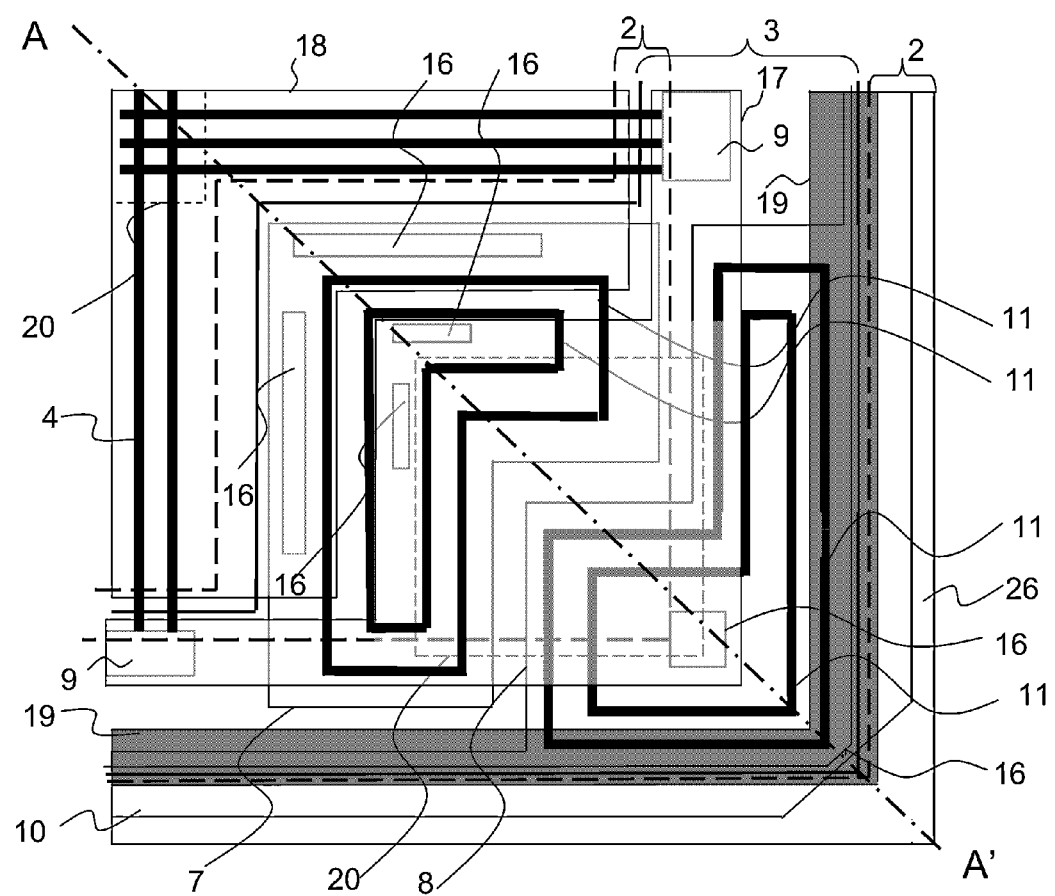
FIG. 16 is a plan view illustrating a configuration of a semiconductor device according to a third exemplary embodiment of the present disclosure.

FIG. 16 is a plan view of a semiconductor device according to the third exemplary embodiment of the present disclosure. The A-A' sectional view is the same as that in FIG. 10. In FIG. 16, while the area in which the gate-drain zener diodes 22 are formed has an L planar shape, other configurations are the same as those illustrated in FIG. 9.

The present disclosure is not limited to the above example. Various variations can be made to the shape of the zener diode layout areas according to the present disclosure. In the first exemplary embodiment, the area in which the gate-source zener diodes 21 are laid out has an L planar shape and the area in which the gate-drain zener diodes 22 are laid out has a rectangular planar shape. However, alternatively, the area in which the gate-source zener diodes 21 are laid out may have a rectangular planar shape and the area in which the gate-drain zener diodes 22 are laid out may have an L planar shape.

If the planar shape of the zener diode layout area is changed from a rectangular shape to an L shape, since the peripheral length is increased, the cross-sectional area is increased. Thus, it is possible to reduce the dynamic resistance of the zener diode.

If a combination of an L shape and a rectangular shape or a combination of L shapes is used, it is preferable that the entire area in which the gate-source zener diodes 21 and the gate-drain zener diodes 22 are laid out have a rectangular shape close to a square shape. In this way, the gate pad can be formed in a square shape, which enables easy bonding.

EXEMPLARY EMBODIMENT 4

According to the first exemplary embodiment, the semiconductor device includes the ring-shaped EQR polysilicon layer 10 and the ring-shaped EQR aluminum layer 19 that are arranged at the periphery of the chip. However, the present disclosure is not limited to such example. A semiconductor device according to the present disclosure can be realized without the EQR aluminum layer 19. For example, the present disclosure is applicable, even when the EQR aluminum layer is not formed along a chip edge but formed only at a corner portion of the chip (even when the EQR aluminum layer is not formed in a ring) or even when neither the EQR polysilicon layer nor the EQR aluminum layer is present.

Figure 18:
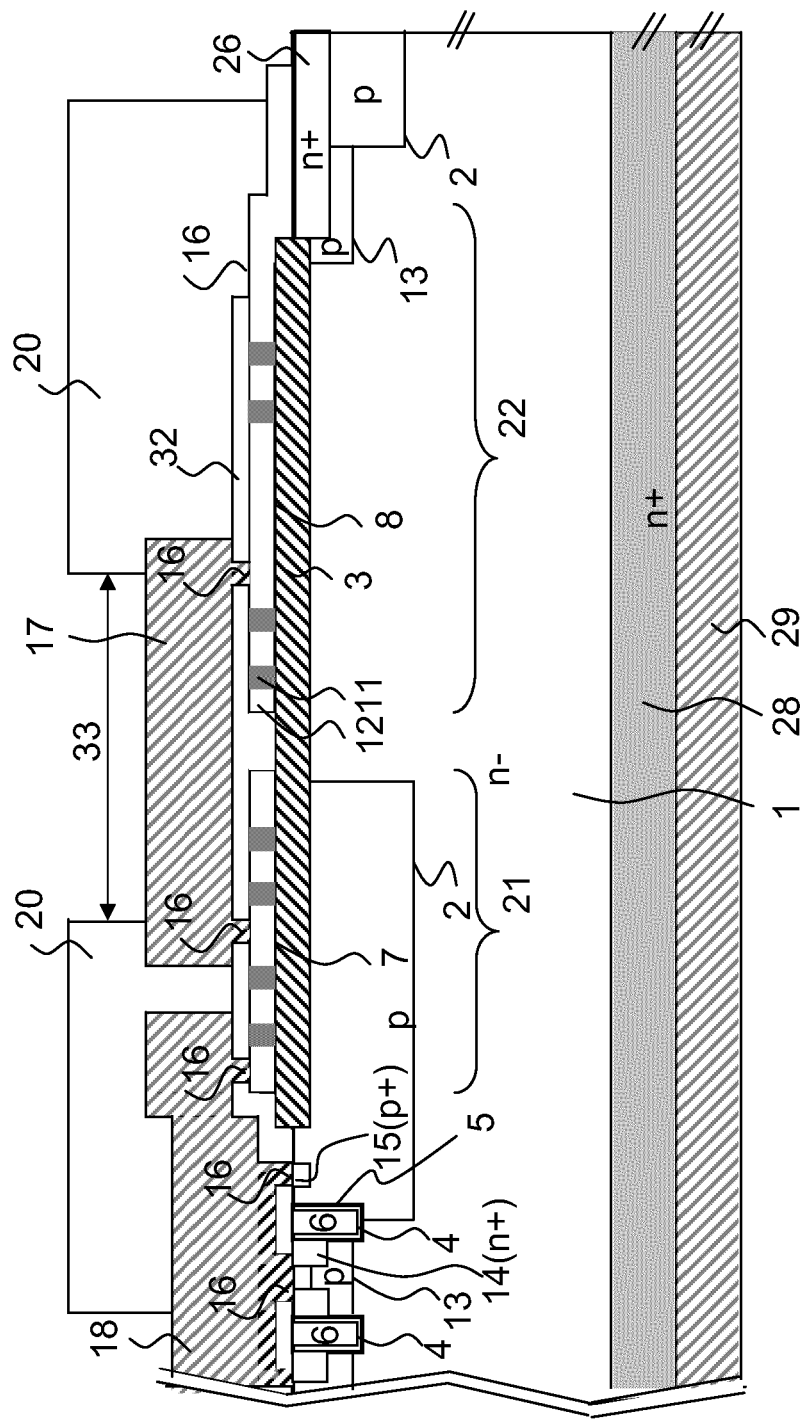
FIG. 18 is a sectional view taken along line A-B, illustrating the configuration of the semiconductor device according to the fourth exemplary embodiment of the present disclosure.

FIGS. 17A and 17B are a plan view and a sectional view, respectively, illustrating a configuration of a semiconductor device according to a fourth exemplary embodiment of the present disclosure. FIG. 17A is a plan view in which neither the EQR polysilicon layer nor the EQR aluminum layer is present. FIG. 17B is a sectional view taken along line A-A' in FIG. 17A. This A-A' sectional view is similar to that illustrated in FIG. 10. FIG. 17A is different from FIG. 9A in that a contact aluminum layer 31 (a first electrode) is used as the aluminum layer located at the bottom right in FIG. 17A, instead of the EQR aluminum layer 19 in FIG. 17A. FIG. 18 is a sectional view taken along line A-B in FIG. 17A (taken along a dashed line extending from A toward A' and bent to extend to B at an opening 16). The gate-drain zener diodes 22 and the scribe diffusion layer 26 (having the same potential as that of the drain) are into contact with each other via the contact aluminum layer 31 at a corner portion of the chip.

Various variations can be made to the configuration of the semiconductor device according to the present disclosure, without being limited to the above exemplary embodiments. In the above exemplary embodiments, the gate-drain zener diodes 22 and the drain are connected via the EQR aluminum layer 19 or the contact aluminum layer 31 and the scribe diffusion layer 26. However, the present disclosure is not limited to such examples. As illustrated in FIGS. 1 and 2 in PTL 2, connection between the drain aluminum electrode and the drain N layer is applicable. In addition, by modifying connection to the drain area and arrangement of the pad, the EQR aluminum layer can be used as the drain electrode and the drain pad. In this way, the source, gate, and drain terminals can be formed on a chip surface. In this case, the drain electrode formed like the EQR aluminum layer is corresponding to a first electrode.

In addition, in the above exemplary embodiments, the gate-source zener diodes 21 and the gate-drain zener diodes 22 are formed as N/P/N/P/N layers of concentric loop bands. However, the stage number and the impurity concentration of the zener diodes are not limited to the above examples. For example, the gate-source zener diodes 21 and the gate-drain zener diodes 22 may be formed as N/P/N layers, N⁺/P/N⁺ layers, or N/P/N/P/N/P/N layers, to obtain desired withstand voltage. Alternatively, other than aluminum, the electrodes may be formed by an aluminum alloy, copper, or the like.

In addition, a transistor of the semiconductor device according to the present disclosure is applicable not only to a MOSFET but also to an IGBT. In this case, by laying out a P type buffer layer between the N type high concentration substrate 28 and the drain electrode 29 in FIG. 10, it is possible to form an insulated gate bipolar transistor in which the source electrode and the drain electrode serve as an emitter electrode and a collector electrode, respectively. In this case, a second electrode is corresponding to the emitter electrode, a first electrode is corresponding to an electrode such as the EQR aluminum layer 19 and the contact aluminum layer 31 described above, which is electrically connected to a collector electrode.

The above description has been made assuming that an N type MOSFET is included in the semiconductor device. If a P type MOSFET is included in the semiconductor device, the N type and P type elements in the above exemplary embodiments are reversed. However, regarding the configurations of the gate-source zener diodes 21 and the gate-drain zener diodes 22, there is no need to change the N type and P type elements.

The disclosures of the above Patent Literatures and the like are incorporated herein by reference thereto. Modifications and adjustments of the exemplary embodiments and examples are possible within the scope of the overall disclosure (including the claims) of the present disclosure and based on the basic technical concept of the present disclosure. Various combinations and selections of various disclosed elements (including the elements in each of the claims, examples, drawings, etc.) are possible within the scope of the claims of the present disclosure. That is, the present disclosure of course includes various variations and modifications that could be made by those skilled in the art according to the overall disclosure including the claims and the technical concept. Numerical numbers disclosed are only by way of example and any other numbers may be selected as necessary.

What is claimed is:

1. A semiconductor device, comprising:
   a transistor having a gate electrode, a first electrode, and a second electrode; and
   first and second protection circuits each having one end commonly connected to the gate electrode and the other end connected to the first and second electrodes, respectively;
   wherein the first and second protection circuits are formed in first and second polysilicon layers, respectively, formed separately on a single field insulating film,
   wherein the first electrode is electrically connected to a drain electrode of the transistor, and the second electrode is a source electrode of the transistor.

2. The semiconductor device according to claim 1,
   wherein an overall area in which the first and second protection circuits are arranged has an approximately square shape.

3. The semiconductor device according to claim 2,
   wherein at least one of the first and second center portions has an L shape as viewed from a direction perpendicular to a substrate.

4. The semiconductor device according to claim 3,
   wherein the other one of the first and second center portions has an L shape or a square shape as viewed from the direction perpendicular to the substrate.

5. The semiconductor device according to claim 1,
   wherein the first protection circuit further comprises another circular band portion of the first conductivity type and another circular band portion of the second conductivity type between the first center portion and the second band portion; and
   wherein the second protection circuit further comprises another circular band portion of the first conductivity type and another circular band portion of the second conductivity type between the second center portion and the fourth band portion.

6. The semiconductor device according to claim 1,
   wherein the first protection circuit further comprises a band diffused resistor circularly arranged outside the second band portion; and
   wherein the first electrode is connected to the outside of the diffused resistor, instead of the second band portion.

7. The semiconductor device according to claim 1,
   wherein the transistor is a metal-oxide-semiconductor field-effect transistor (MOSFET) or an insulated gate bipolar transistor (IGBT).

8. A semiconductor device, comprising:
   a transistor having a gate electrode, a first electrode, and a second electrode; and
   first and second protection circuits each having one end commonly connected to the gate electrode and the other end connected to the first and second electrodes, respectively;
   wherein the first and second protection circuits are formed in first and second polysilicon layers, respectively, formed separately on a single field insulating film,
   wherein the first protection circuit comprises: a first center portion of a first conductivity type arranged in a center portion of the first polysilicon layer; a first band portion of a second conductivity type circularly arranged outside the first center portion; and a second band portion of the first conductivity type circularly arranged outside the first band portion;
   wherein the second protection circuit comprises: a second center portion of the first conductivity type arranged in a center portion of the second polysilicon layer; a third band portion of the second conductivity type circularly arranged outside the second center portion; and a fourth band portion of the first conductivity type circularly arranged outside the third hand portion; and
   wherein the first and second center portions are commonly connected to the gate electrode via a gate wiring film, the second band portion is connected to the first electrode, and the fourth band portion is connected to the second electrode.

9. The semiconductor device according to claim 8,
   wherein the gate wiring film comprises a gate pad in an area that overlaps with the first and second polysilicon layers.

10. The semiconductor device according to claim 9,
    wherein the second band portion in the first polysilicon layer is connected to the first electrode on a chip edge side.

* * * * *